United States Patent
Nagai et al.

(10) Patent No.: US 7,561,461 B2
(45) Date of Patent: Jul. 14, 2009

(54) NON-VOLATILE SEMICONDUCTOR MEMORY DEVICE

(75) Inventors: Hiroyasu Nagai, Osaka (JP); Masayoshi Nakayama, Shiga (JP)

(73) Assignee: Panasonic Corporation, Osaka (JP)

( * ) Notice: Subject to any disclaimer, the term of this patent is extended or adjusted under 35 U.S.C. 154(b) by 97 days.

(21) Appl. No.: 11/953,412

(22) Filed: Dec. 10, 2007

(65) Prior Publication Data
US 2008/0205119 A1    Aug. 28, 2008

(30) Foreign Application Priority Data
Feb. 28, 2007   (JP) .............................. 2007-049491

(51) Int. Cl.
*G11C 11/00*    (2006.01)
(52) U.S. Cl. .............. 365/148; 365/189.07; 365/189.09
(58) Field of Classification Search ................. 365/148, 365/189.07, 189.09, 210.1
See application file for complete search history.

(56) References Cited

U.S. PATENT DOCUMENTS

| 6,259,644 | B1 | 7/2001 | Tran et al. |
| 6,885,579 | B2 | 4/2005 | Sakimura et al. |
| 7,499,344 | B2 * | 3/2009 | Nirschl et al. .......... 365/189.07 |

* cited by examiner

*Primary Examiner*—David Lam
(74) *Attorney, Agent, or Firm*—McDermott Will & Emery LLP

(57) ABSTRACT

In order to determine data stored in a memory cell of a resistive cross-point cell array, two reference cells having two different known resistance values (e.g., data "0" and data "1") are provided, and a difference in current between a selected cell and the reference cell having data "0" and a difference in current between the selected cell and the reference cell having data "1" are compared. By comparison with a current of the reference cell which has a parasitic current as with the selected cell and has known data "0"/"1", data can be determined while suppressing an influence of a parasitic current.

19 Claims, 11 Drawing Sheets

NON-VOLATILE SEMICONDUCTOR MEMORY DEVICE

BACKGROUND OF THE INVENTION

1. Field of the Invention

The present invention relates to a resistive cross-point cell array, and more particularly, to a technique for highly reliably determining data stored in a memory cell of the array.

2. Description of the Related Art

A Magnetic Random Access Memory (hereinafter referred to as an MRAM) and a Resistive Random Access Memory (hereinafter referred to as a ReRAM) have attracted attention as a non-volatile memory which enables high-speed write and a large number of rewritable times. Hereinafter, an MRAM will be described.

A typical MRAM includes an array of memory cells. A word line is extended along each row of memory cells, and a bit line is extended along each column of memory cells. Each memory cell is located at a cross point of a word line and a bit line.

Each memory cell stores 1-bit information as a direction of magnetization. The magnetization of each memory cell has one of two stable directions at any particular time. The two stable directions represent logical values "0" and "1".

The direction of magnetization has an influence on the resistance of a memory cell as in a spin-dependent tunnel junction device. For example, when the direction of magnetization is parallel, the resistance of a memory cell has a first value R, and when the direction of magnetization is changed from "parallel" to "reverse parallel", the resistance of the memory cell increases to a second value R+ΔR. The direction of magnetization (i.e., logic state) of a selected memory cell can be read by detecting the resistance of the selected memory cell.

In MRAMs, memory cells are arranged in the following two known manners: magnetic resistance elements are connected via access transistors to bit lines; and magnetic resistance elements are directly connected to word lines and bit lines. The latter arrangement is suitable for higher-density integration, but has a lower level of memory cell selectivity than that of the former arrangement. The memory cell array of the latter arrangement is known as a cross-point cell array.

The reliability of determining data in a memory cell of an MRAM employing a cross-point cell array is impaired by, for example, a parasitic current (or a sneak path current). The memory cells in the cross-point cell array are connected by a large number of parallel paths. The sneak path current refers to a current which flows via the parallel path without passing through a memory cell to be read. The sneak path current hinders accurate detection of the resistance of a memory cell when data stored in the memory cell is determined.

A technique of highly reliably detecting the resistance of a memory cell in a cross-point cell array while suppressing the influence of a sneak path current has been proposed. In this technique, during a read operation with respect to a memory cell in an MRAM, equal potentials are applied to a selected bit line and non-selected bit lines (or non-selected word lines) (see U.S. Pat. No. 6,259,644).

In this technique, however, the potentials applied to a selected bit line and non-selected bit lines (or non-selected word lines) need to be equal to each other with high precision, which is not very practical. Therefore, according to another conventional technique, a current flowing through a dummy cell or a reference cell is subtracted from a current flowing through a selected cell, thereby suppressing the influence of a sneak path current (see U.S. Pat. No. 6,885,579).

FIG. 10 is a diagram showing an exemplary circuit configuration of a conventional MRAM employing dummy cells. The MRAM includes a cross-point cell array 1001, memory cells 1002 arranged in x and y directions, bit lines 1004 extended in the y direction, dummy cells 1008 arranged in the y direction, and a dummy bit line 1009 extended in the y direction. The dummy cells 1008 are provided at cross points of word lines 1003 and the dummy bit line 1009. Each dummy cell 1008 is interposed between one word line 1003 and the dummy bit line 1009 which intersect at the dummy cell 1008. Data of either "1" or "0" is written into each dummy cell 1008. It is important for the dummy cells 1008 to have a stable condition, and data does not necessarily need to be written therein. The dummy cells 1008 contribute to the removal of offset components of currents flowing through the memory cells 1002, thereby increasing an SN ratio during read.

The cross-point cell array 1001 further includes an X selector 1011, a first Y selector 1012, and a second Y selector 1013. The X selector 1011 is connected to the word lines 1003 and selects one (selected word line) of the word lines 1003. The first Y selector 1012 and the second Y selector 1013 are connected to the bit lines 1004 and select one (selected bit line) of the bit lines 1004. One of the memory cells 1002 which is connected to the selected word line and the selected bit line is selected as a selected cell 1002a. Further, one of the dummy cells 1008 which is connected to the selected word line is selected as a selected dummy cell 1008a. The selected dummy cell 1008a is used to remove the offset component of a current flowing through the selected cell 1002a.

Data stored in the selected cell 1002a is determined by a read circuit 1016. The read circuit 1016 supplies a potential V2' which is substantially the same as a potential V2 of a second power supply line 1015, to the selected bit line and the dummy bit line 1009, in order to determine the data stored in the selected cell 1002a. On the other hand, the X selector 1011 applies a potential V1 of a first power supply line 1014 to the selected word line. Due to the application of the potential V2' to the selected bit line, a potential V2'-V1 is applied between the selected bit line and the selected word line, so that a current Is flows through the selected bit line. On the other hand, the potential V2'-V1 is also applied between the dummy bit line 1009 and the selected word line, so that a current Ic flows through the dummy bit line 1009. Since the potential V2 applied to non-selected bit lines is substantially equal to the potential V2' applied to the selected bit line and the dummy bit line 1009, a sneak path current flowing through the cross-point cell array 1001 is reduced. The read circuit 1016 determines the data stored in the selected cell 1002a based on a difference Is-Ic between the current Is flowing through the selected bit line and the current Ic flowing through the dummy bit line 1009.

The read circuit 1016 is implemented by a subtraction circuit 1017, an I-V conversion circuit 1018, a voltage holding circuit 1019, and a comparator 1020. The subtraction circuit 1017 is connected via the second Y selector 1013 to the selected bit line and the dummy bit line 1009, and generates a current Is-Ic which is obtained by subtracting the offset component current Ic flowing through the dummy bit line 1009 from the detection current Is flowing through the selected bit line. The I-V conversion circuit 1018 converts the current Is-Ic output by the subtraction circuit 1017 into a voltage and outputs the voltage. An output of the I-V conversion circuit 1018 is connected to inputs of the voltage holding circuit 1019 and the comparator 1020. The voltage holding circuit 1019 takes in and holds the voltage output by the I-V conversion circuit 1018 which corresponds to the data stored in the selected cell 1002a, and outputs the held voltage as a first read voltage Vp1. Next, data "0" is written into the selected cell 1002a, and a voltage which is output by the I-V conversion circuit 1018, corresponding to data "0" is a second read voltage Vp2. The comparator 1020 compares the first read voltage Vp1 output by the voltage holding circuit 1019 with the second read voltage Vp2 output by the I-V conversion circuit 1018, thereby determining original stored data of the selected cell 1002a, and generates a data signal SAOUT corresponding to the original stored data. Further, when it is determined that the original stored data is "1", data "1" is written into the selected cell 1002a (rewrite operation).

In the conventional MRAM of FIG. 10, it is important that the current Is flowing through the selected bit line and the current Ic flowing through the dummy bit line 1009 have offset components whose magnitudes are close to each other. The offset component refers to a current component mainly caused by a sneak path current. The magnitude of the offset component varies depending on states of surrounding memory cells. Therefore, the offset components of the current Is flowing through the selected bit line and the current Ic flowing through the dummy bit line 1009 have a difference. If the difference between the offset components is large, erroneous read occurs. Further, a larger number of dummy cells 1008 need to be provided in the cross-point cell array 1001 in order to reduce the difference between the offset components, resulting in an increase in cell area.

On the other hand, when a predetermined reference current is used to determine data stored in a memory cell of a resistive cross-point cell array, erroneous read occurs as will be hereinafter described with reference to FIGS. 11A to 11C.

FIGS. 11A to 11C are diagrams showing changes in memory cell current Is of a conventional non-volatile semiconductor memory device (distributions of memory cell currents), where the horizontal axis represents memory cell currents and the vertical axis represents the number of memory cells. FIG. 11A shows a distribution of memory cell currents in the absence of a sneak path current. In FIG. 11A, 1101 indicates a distribution of memory cell currents having data "0", 1102 indicates a distribution of memory cell currents having data "1", and Ir indicates a predetermined reference current.

FIGS. 11B and 11C are diagrams showing distributions of memory cell currents in the presence of a sneak path current. FIGS. 11B and 11C show how the sneak path current successively increases, and the memory cell current increases due to an increase in the sneak path current. In FIGS. 11B and 11C, 1103 and 1105 indicate distributions of memory cell currents having data "0", and 1104 and 1106 indicate distributions of memory cell currents having data "1".

As shown in FIG. 11A, if a memory cell current is smaller than a predetermined reference current Ir, data is determined to be "0". If a memory cell current is larger than the reference current Ir, data is determined to be "1". When there is not a sneak path current as shown in FIG. 11A or when there is a small sneak path current as shown in FIG. 11B, data stored in a memory cell can be correctly determined. However, when there is a large sneak path current as shown in FIG. 11C, data "0" is determined to be data "1", i.e., erroneous read occurs.

SUMMARY OF THE INVENTION

An object of the present invention is to provide a technique for highly reliably determining data stored in a memory cell of a resistive cross-point cell array while removing an influence of a sneak path current.

To achieve the object, in the present invention, data stored in a memory cell of a resistive cross-point cell array is determined by providing two different reference currents (a first reference current and a second reference current), and comparing a difference in current between a selected cell and the first reference current with a difference in current between the selected cell and the second reference current.

Alternatively, the data is determined by providing two reference cells having two different known resistance values (e.g., data "0" and data "1"), and comparing a difference in current between a selected cell and the reference cell having data "0" with a difference in current between the selected cell and the reference cell having data "1".

Other embodiments and advantages of the present invention will become more apparent from the following detailed description of the present invention when taken in conjunction with the accompanying drawings illustrating the principle of the present invention.

DETAILED DESCRIPTION OF THE PREFERRED EMBODIMENTS

Hereinafter, embodiments of the present invention will be described with reference to the accompanying drawings. Note that, in all non-volatile semiconductor memory devices described below, memory cells constitute a resistive cross-point cell array. Note that the resistive cross-point cell array is not limited to MRAM and ReRAM.

First Embodiment

Figure 1:
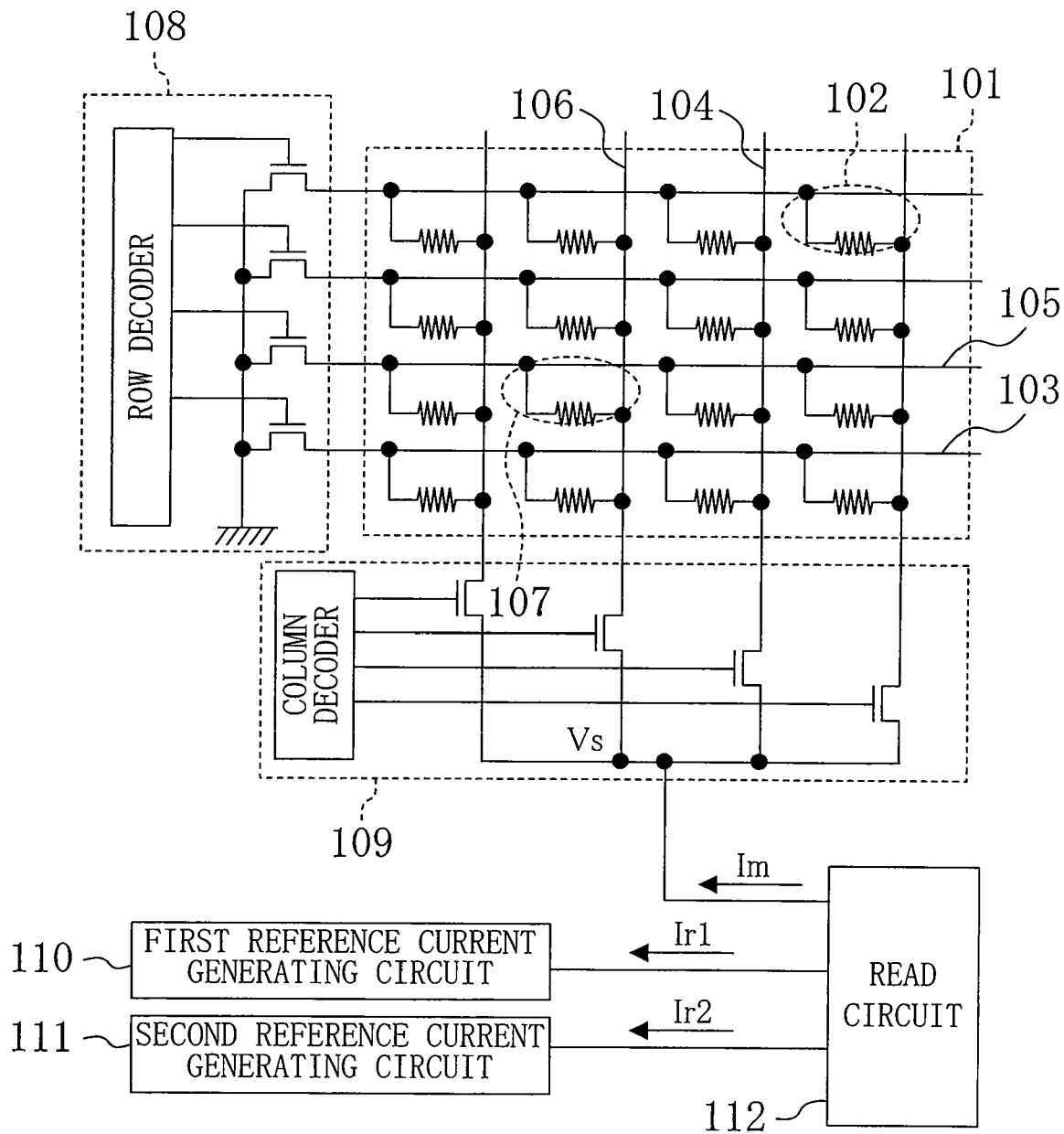
FIG. 1 is a diagram showing a circuit configuration of a non-volatile semiconductor memory device according to a first embodiment of the present invention.

FIG. 1 is a diagram showing a circuit configuration of a non-volatile semiconductor memory device according to a first embodiment of the present invention. In FIG. 1, 101 indicates a cross-point cell array, 102 indicates memory cells, 103 indicates word lines, 104 indicates bit lines, 105 indicates a selected word line, 106 indicates a selected bit line, 107 indicates a selected cell, 108 indicates a first decoding circuit, 109 indicates a second decoding circuit, 110 indicates a first reference current generating circuit, 111 indicates a second reference current generating circuit, and 112 indicates a read circuit.

As shown in FIG. 1, the cross-point cell array 101 includes the word lines 103 and the bit lines 104. The memory cells 102 are provided at cross points of the word lines 103 and the bit lines 104 and are interposed between the word lines 103 and the bit lines 104.

The first decoding circuit 108, to which the word lines 103 are connected, selects the selected word line 105 from the word lines 103. The second decoding circuit 109, to which the bit lines 104 are connected, selects the selected bit line 106 from the bit lines 104. The selected cell 107 is a memory cell which is connected to the selected word line 105 and the selected bit line 106. During read, the first decoding circuit 108 grounds the selected word line 105 of the word lines 103, and causes non-selected word lines to be in a floating state (HiZ state). The second decoding circuit 109 connects the selected bit line 106 of the bit lines 104 to the read circuit 112, and cuts off the non-selected bit lines from the read circuit 112.

Data stored in the selected cell 107 is determined by the read circuit 112. The second decoding circuit 109, the first reference current generating circuit 110, and the second reference current generating circuit 111 are connected to the read circuit 112. The read circuit 112 supplies a potential Vs to the selected bit line 106 in order to determine the data stored in the selected cell 107. Due to the application of the potential Vs to the selected bit line 106, the potential Vs is applied between the selected bit line 106 and the selected word line 105, so that a current Im flows through the selected bit line 106.

The current Im flowing through the selected bit line 106 is a current which has components, such as those described below. A resistance of the selected cell 107 varies depending on the data stored in the selected cell 107. Therefore, the current Im flowing through the selected bit line 106 contains a data-dependent component which varies depending on the data stored in the selected cell 107. The current Im also contains, in addition to the data-dependent component, an offset component which is not a current component dependent on the data stored in the selected cell 107. The offset component is a current component which is mainly caused by a sneak path current. The cross-point cell array 101 has a large number of paths through which a sneak path current flows, so that the offset component is actually considerably larger than the data-dependent component. Therefore, the SN ratio of the current Im itself is not large.

The first reference current generating circuit 110 generates a first reference current Ir1, and the second reference current generating circuit 111 generates a second reference current Ir2 which has a value larger than that of Ir1. The read circuit 112 compares a difference Im−Ir1 between the current Im flowing through the selected bit line 106 and the first reference current Ir1 with a difference Im−Ir2 between the current Im flowing through the selected bit line 106 and the second reference current Ir2, thereby determining the data stored in the selected cell 107.

Figure 2A:
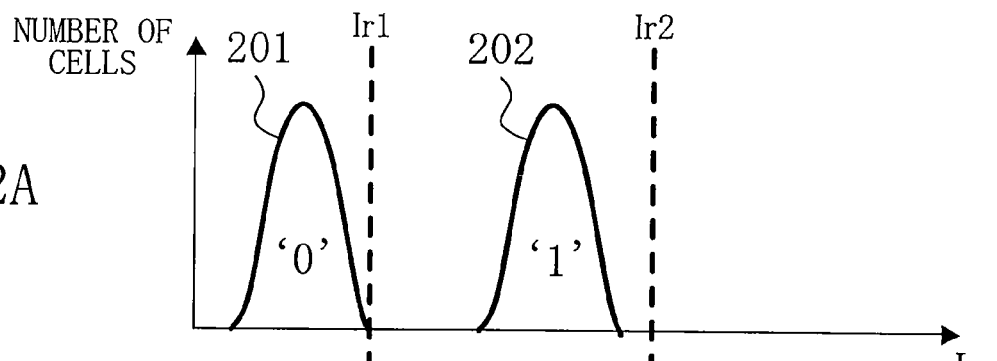
FIGS. 2A to 2C are diagrams showing changes in memory cell current of the non-volatile semiconductor memory device of the first embodiment of the present invention.
Figure 2B:
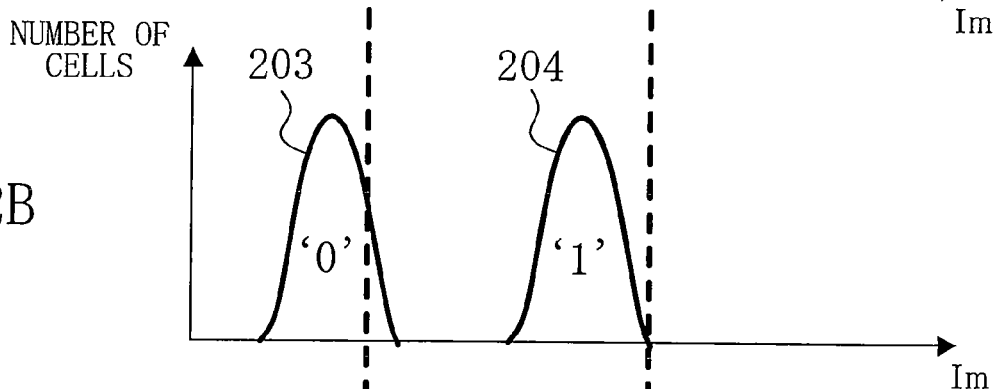
Figure 2C:
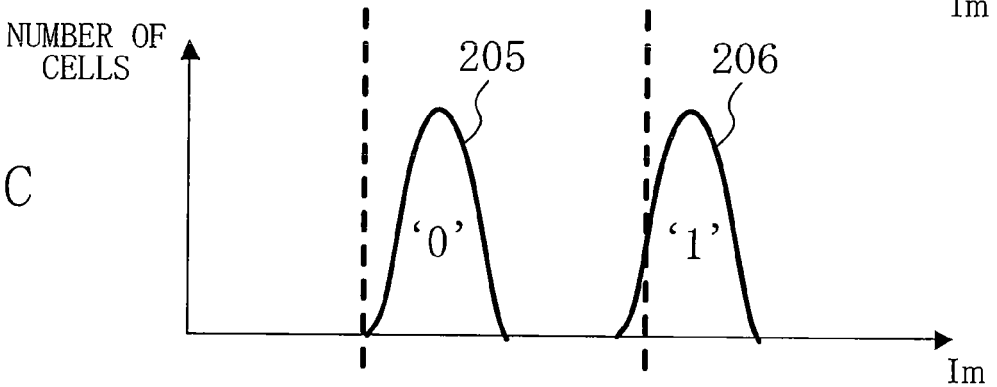

FIGS. 2A to 2C are diagrams showing changes in memory cell current of the non-volatile semiconductor memory device of the first embodiment of the present invention (distributions of memory cell currents), where the horizontal axis represents memory cell currents and the vertical axis represents the number of memory cells. FIG. 2A shows a distribution of memory cell currents in the absence of a sneak path current. In FIG. 2A, 201 indicates a distribution of memory cell currents having data "0", 202 indicates a distribution of memory cell currents having data "1", Ir1 indicates a first reference current, and Ir2 indicates a second reference current.

FIGS. 2B and 2C are diagrams showing distributions of memory cell currents in the presence of a sneak path current. FIGS. 2B and 2C show how the sneak path current successively increases, and the memory cell current increases due to an increase in the sneak path current. In FIGS. 2B and 2C, 203 and 205 indicate distributions of memory cell currents having data "0", and 204 and 206 indicate distributions of memory cell currents having data "1".

Data is read out from the non-volatile semiconductor memory device of the first embodiment of the present invention as follows. As shown in FIG. 2A, a difference between the first reference current Ir1 and a memory cell current and a difference between the second reference current Ir2 and the memory cell current are compared. If the difference between the first reference current Ir1 and the memory cell current is smaller, data is determined to be "0". If the difference between the second reference current Ir2 and the memory cell current is smaller, data is determined to be "1". Erroneous read does not occur and data stored in memory cell can be correctly determined even in the state in which there is a large sneak path current as shown in FIG. 2C in addition to the state in which there is not a sneak path current as shown in FIG. 2A and the state in which there is a small sneak path current as shown in FIG. 2B.

Second Embodiment

Figure 3:
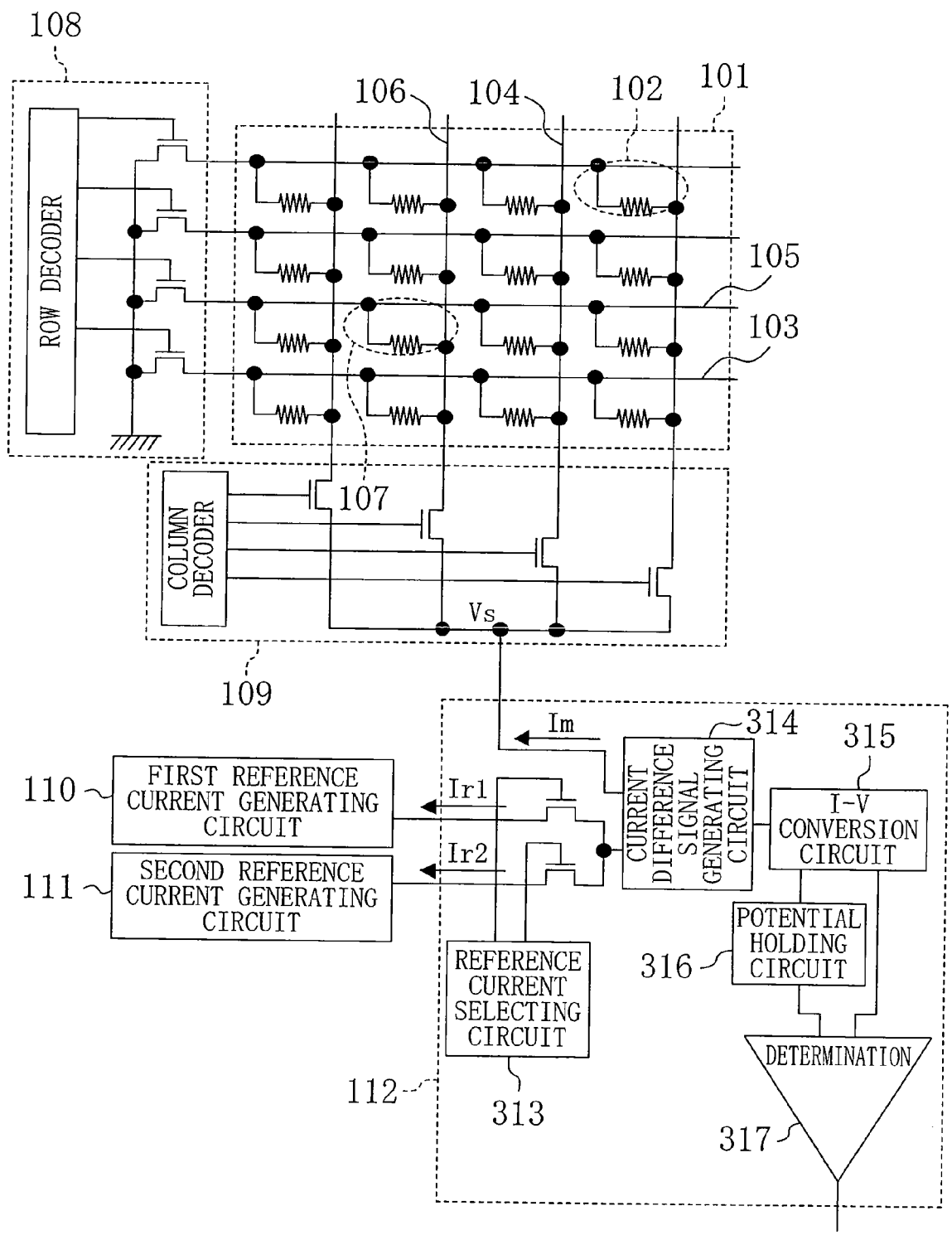
FIG. 3 is a diagram showing a circuit configuration of a non-volatile semiconductor memory device according to a second embodiment of the present invention.

FIG. 3 is a diagram showing a circuit configuration of a non-volatile semiconductor memory device according to a second embodiment of the present invention, particularly showing a detailed circuit configuration of the read circuit 112 of FIG. 1. In FIG. 3, 313 indicates a reference current selecting circuit, 314 indicates a current difference signal generating circuit, 315 indicates an I-V conversion circuit, 316 indicates a potential holding circuit, and 317 indicates a determination circuit.

As shown in FIG. 3, the selected bit line 106 is connected via the second decoding circuit 109 to the current difference signal generating circuit 314, and further, the first reference current generating circuit 110 and the second reference current generating circuit 111 are connected via the reference current selecting circuit 313 to the current difference signal generating circuit 314. The current difference signal generating circuit 314 is connected to the I-V conversion circuit 315. The I-V conversion circuit 315 is connected to the determination circuit 317, and further, the I-V conversion circuit 315 is connected via the potential holding circuit 316 to the determination circuit 317.

Next, a read operation will be described with reference to FIG. 3. During a first read operation period, the reference current selecting circuit 313 connects the first reference current generating circuit 110 to the current difference signal generating circuit 314, and the current difference signal generating circuit 314 generates a current difference signal corresponding to the difference Im−Ir1 between the current Im flowing through selected bit line 106 and the first reference current Ir1. The I-V conversion circuit 315 is a current-voltage amplifier which converts the current difference signal output by the current difference signal generating circuit 314 into a voltage and outputs the voltage. The potential holding circuit 316 takes in and holds the voltage output by the I-V conversion circuit 315, and outputs the held voltage.

During a second read operation period, the reference current selecting circuit 313 connects the second reference current generating circuit 111 to the current difference signal generating circuit 314, and the current difference signal generating circuit 314 generates a current difference signal corresponding to the difference Im−Ir2 between the current Im flowing through the selected bit line 106 and the second reference current Ir2. The I-V conversion circuit 315 is a current-voltage amplifier which converts the current difference signal output by the current difference signal generating circuit 314 into a voltage and outputs the voltage. The determination circuit 317 compares the voltage output by the I-V conversion circuit 315 with the voltage output by the potential holding circuit 316, thereby determining the data stored in the selected cell 107.

By means of the circuit configuration of FIG. 3 and the two read operations (the first read operation and the second read operation), the read circuit 112 compares the difference Im−Ir1 between the current Im flowing through the selected bit line 106 and the first reference current Ir1 with the difference Im−Ir2 between the current Im flowing through the selected bit line 106 and the second reference current Ir2, thereby making it possible to determine the data stored in the selected cell 107.

Third Embodiment

Figure 4:
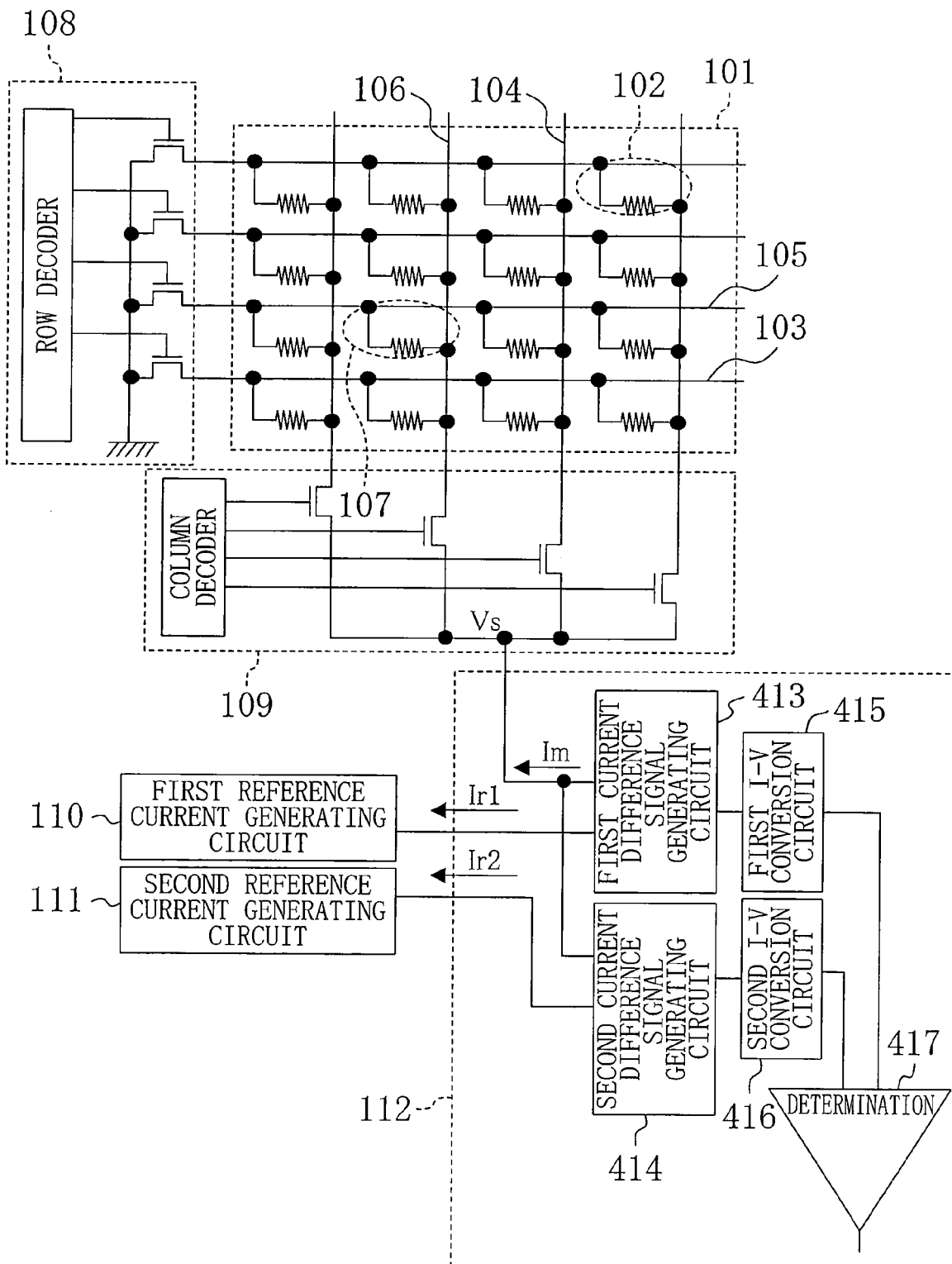
FIG. 4 is a diagram showing a circuit configuration of a non-volatile semiconductor memory device according to a third embodiment of the present invention.

FIG. 4 is a diagram showing a circuit configuration of a non-volatile semiconductor memory device according to a third embodiment of the present invention, particularly showing a detailed circuit configuration of the read circuit 112 of FIG. 1. In FIG. 4, 413 indicates a first current difference signal generating circuit, 414 indicates a second current difference signal generating circuit, 415 indicates a first I-V conversion circuit, 416 indicates a second I-V conversion circuit, and 417 indicates a determination circuit.

As shown in FIG. 4, the selected bit line 106 is connected via the second decoding circuit 109 to the first current difference signal generating circuit 413, and further, the first reference current generating circuit 110 is connected to the first current difference signal generating circuit 413. The selected bit lines 106 are connected via the second decoding circuit 109 to the second current difference signal generating circuit 414, and further, the second reference current generating circuit 111 is connected to the second current difference signal generating circuit 414. The first current difference signal generating circuit 413 is connected to the first I-V conversion circuit 415. The second current difference signal generating circuit 414 is connected to the second I-V conversion circuit 416. The first I-V conversion circuit 415 and the second I-V conversion circuit 416 are connected to the determination circuit 417.

Next, a read operation will be described with reference to FIG. 4. The first current difference signal generating circuit 413 generates a current difference signal corresponding to the difference Im−Ir1 between the current Im flowing through the selected bit line 106 and the first reference current Ir1. The first I-V conversion circuit 415 is a current-voltage amplifier which converts the current difference signal output by the first current difference signal generating circuit 413 into a voltage and outputs the voltage. The second current difference signal generating circuit 414 generates a current difference signal corresponding to the difference Im−Ir2 between the current Im flowing through the selected bit line 106 and the second reference current Ir2. The second I-V conversion circuit 416 is a current-voltage amplifier which converts the current difference signal output by the second current difference signal generating circuit 414 into a voltage and outputs the voltage. The determination circuit 417 compares the voltage output by the first I-V conversion circuit 415 with the voltage output by the second I-V conversion circuit 416, thereby determining the data stored in the selected cell 107.

By means of the circuit configuration of FIG. 4 and a single read operation, the read circuit 112 compares the difference Im−Ir1 between the current Im flowing through the selected bit line 106 and the first reference current Ir1 with the difference Im−Ir2 between the current Im flowing through the selected bit line 106 and the second reference current Ir2, thereby making it possible to determine the data stored in the selected cell 107. Also, as compared to the second embodiment, two read operations are reduced to a single read operation, thereby making it possible to reduce a read time.

Fourth Embodiment

Figure 5:
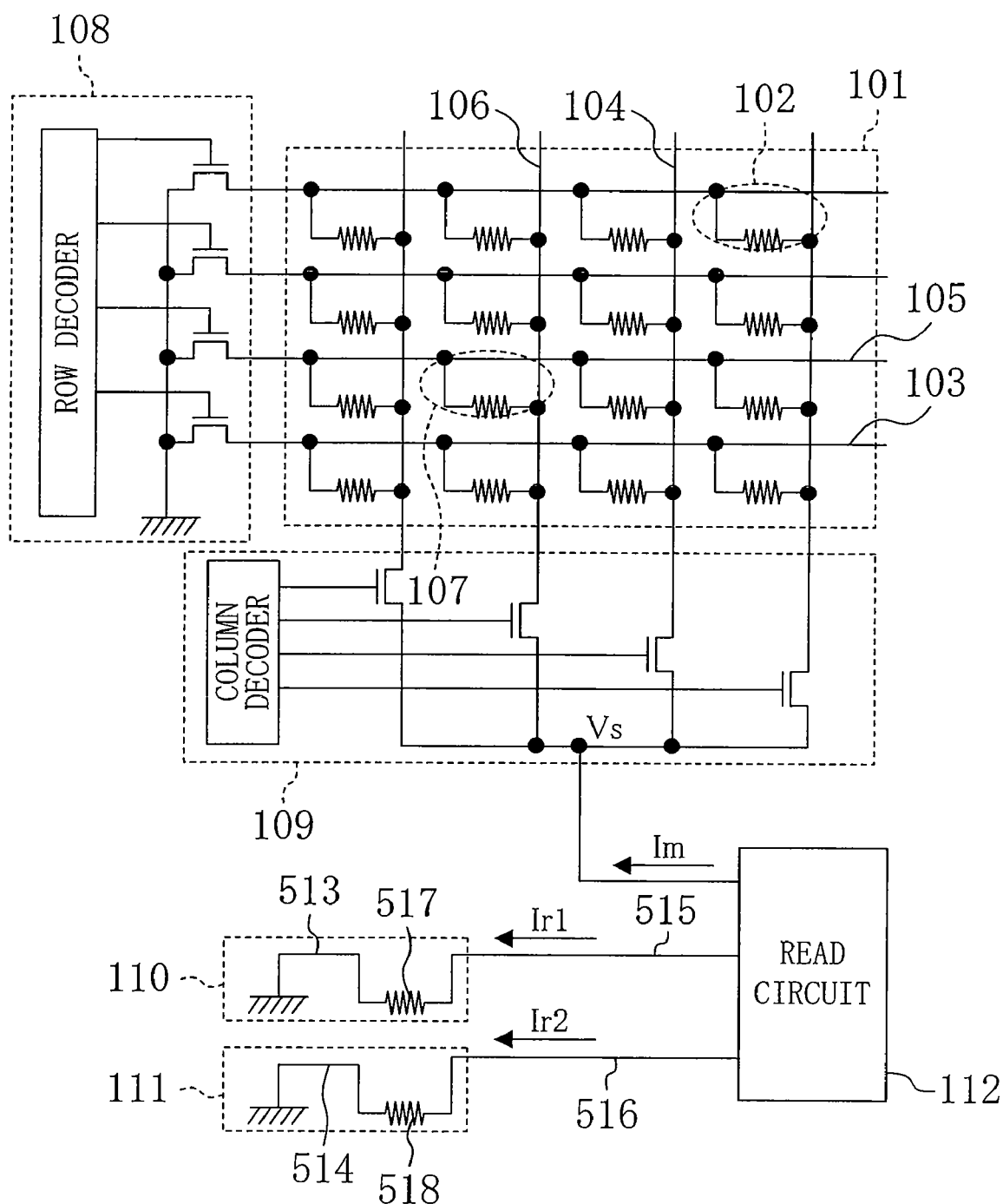
FIG. 5 is a diagram showing a circuit configuration of a non-volatile semiconductor memory device according to a fourth embodiment of the present invention.

FIG. 5 is a diagram showing a circuit configuration of a non-volatile semiconductor memory device according to a fourth embodiment of the present invention, particularly showing the first reference current generating circuit 110 and the second reference current generating circuit 111 of FIG. 1 in detail. In FIG. 5, 513 indicates a first reference word line, 514 indicates a second reference word line, 515 indicates a first reference bit line, 516 indicates a second reference bit line, 517 indicates a first reference cell, and 518 indicates a second reference cell.

The first reference cell 517 and the second reference cell 518 are assumed to have the same structure as that of the memory cell 102. In this case, it is desirable that data "1" or data "0" be stored in the first reference cell 517 and inverted data of the first reference cell 517 be stored in the second reference cell 518.

As shown in FIG. 5, the first reference word line 513 and the second reference word line 514 are grounded. The first reference word line 513 is connected via the first reference cell 517 to the first reference bit line 515. The second reference word line 514 is connected via the second reference cell 518 to the second reference bit line 516. The first reference bit line 515 and the second reference bit line 516 are connected to the read circuit 112.

In the configuration of FIG. 5, the first reference current Ir1 is a current which is caused to flow through the first reference cell 517 by applying a voltage between the first reference word line 513 and the first reference bit line 515. The second reference current Ir2 is a current which is caused to flow through the second reference cell 518 by applying a voltage between the second reference word line 514 and the second reference bit line 516.

By means of the configuration of FIG. 5, the first reference current Ir1 and the second reference current Ir2 can be easily generated.

Fifth Embodiment

Figure 6:
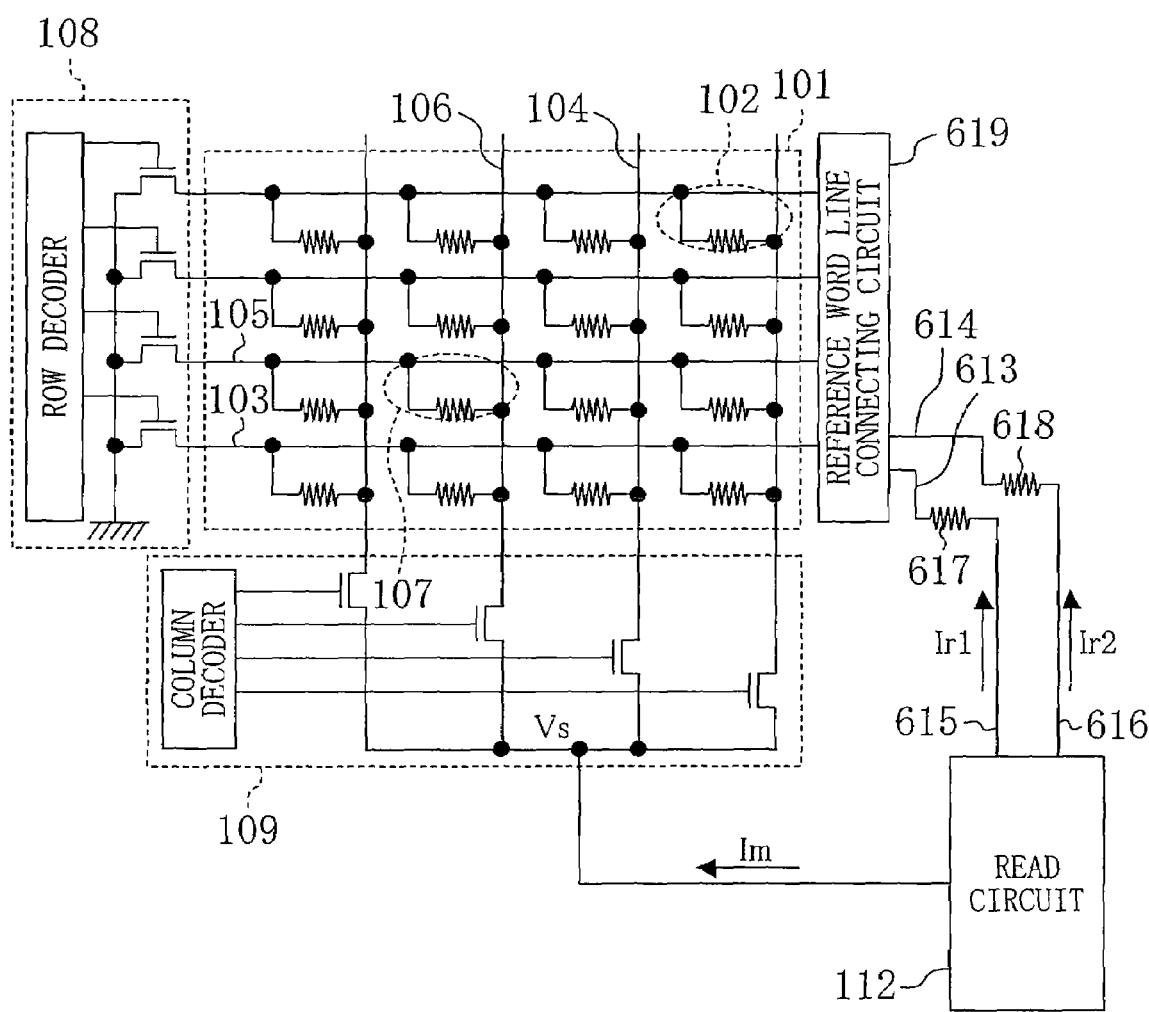
FIG. 6 is a diagram showing a circuit configuration of a non-volatile semiconductor memory device according to a fifth embodiment of the present invention.

FIG. 6 is a diagram showing a circuit configuration of a non-volatile semiconductor memory device according to a fifth embodiment of the present invention, particularly showing the first reference current generating circuit 110 and the second reference current generating circuit 111 of FIG. 1 in detail. In FIG. 6, 613 indicates a first reference word line, 614 indicates a second reference word line, 615 indicates a first reference bit line, 616 indicates a second reference bit line, 617 indicates a first reference cell, 618 indicates a second reference cell, and 619 indicates a reference word line connecting circuit.

The first reference cell 617 and the second reference cell 618 are assumed to have the same structure as that of the memory cell 102. In this case, it is desirable that data "1" or data "0" be stored in the first reference cell 617 and inverted data of the first reference cell 617 be stored in the second reference cell 618.

As shown in FIG. 6, the word lines 103, the first reference word line 613, and the second reference word line 614 are connected to the reference word line connecting circuit 619. The first reference word line 613 is connected via the first reference cell 617 to the first reference bit line 615. The second reference word line 614 is connected via the second reference cell 618 to the second reference bit line 616. The first reference bit line 615 and the second reference bit line 616 are connected to the read circuit 112.

In the configuration of FIG. 6, a first reference current Ir1 is a current which is caused to flow through the first reference cell 617 by applying a voltage between the first reference word line 613 and the first reference bit line 615. A second reference current Ir2 is a current which is caused to flow through the second reference cell 618 by applying a voltage between the second reference word line 614 and the second reference bit line 616.

During a first read operation period, the reference word line connecting circuit 619 connects the first reference word line 613 to a word line 103. During a second read operation period, the reference word line connecting circuit 619 connects the second reference word line 614 to the word line 103.

By means of the configuration of FIG. 6, an offset component mainly caused by a sneak path current is added to the first reference current Ir1 and the second reference current Ir2 as well as the current Im flowing through the selected bit line 106. The read circuit 112 compares the difference Im−Ir1 between the current Im flowing through the selected bit line 106 and the first reference current Ir1 with the difference Im−Ir2 between the current Im flowing through the selected bit line 106 and the second reference current Ir2, thereby determining the data stored in the selected cell 107. Therefore, an influence of a sneak path current can be suppressed.

Sixth Embodiment

Figure 7:
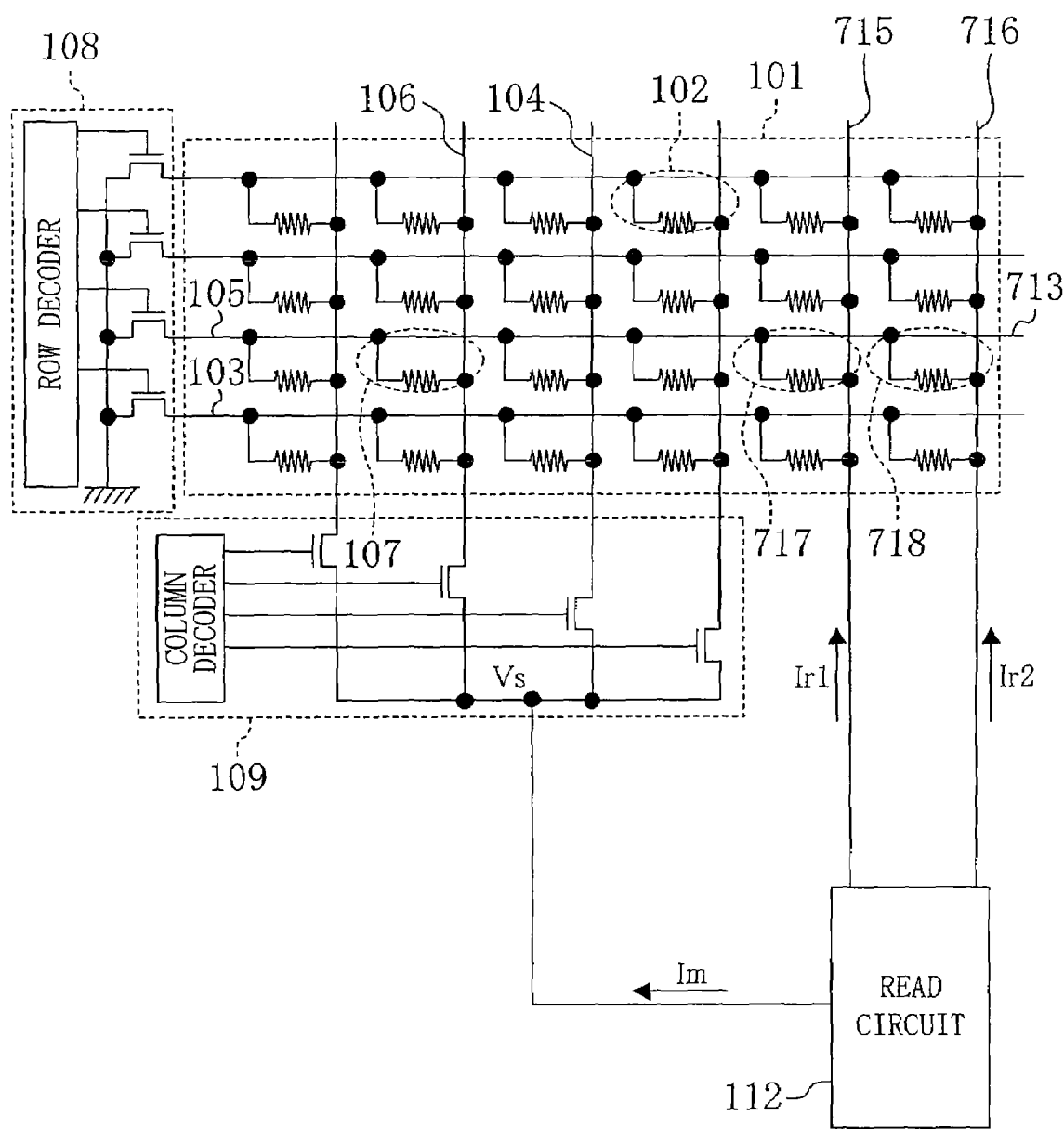
FIG. 7 is a diagram showing a circuit configuration of a non-volatile semiconductor memory device according to a sixth embodiment of the present invention.

FIG. 7 is a diagram showing a circuit configuration of a non-volatile semiconductor memory device according to a sixth embodiment of the present invention, particularly showing the first reference current generating circuit 110 and the second reference current generating circuit 111 of FIG. 1 in detail. In FIG. 7, 713 indicates a selected reference word line, 715 indicates a first reference bit line, 716 indicates a second reference bit line, 717 indicates a first reference cell, and 718 indicates a second reference cell.

As shown in FIG. 7, the selected reference word line 713 is connected via the first reference cell 717 to the first reference bit line 715. The selected reference word line 713 is connected via the second reference cell 718 to the second reference bit line 716. The first reference bit line 715 and the second reference bit line 716 are connected to the read circuit 112.

The first reference cell 717 and the second reference cell 718 are assumed to have the same structure as that of the memory cell 102. The selected reference word line 713 is assumed to be the same as the selected word line 105. The first reference bit line 715 and the second reference bit line 716 are assumed to have the same structure as that of the bit line 104.

In this case, it is desirable that data "1" or data "0" be stored in the first reference cell 717 and inverted data of the first reference cell 717 be stored in the second reference cell 718.

In the configuration of FIG. 7, a first reference current Ir1 is a current which is caused to flow by applying a voltage between the selected word line 105 and the first reference bit line 715. A second reference current Ir2 is a current which is caused to flow by applying a voltage between the selected word line 105 and the second reference bit line 716.

By means of the configuration of FIG. 7, the selected word line 105 is also used as the selected reference word line 713, so that a sneak path current of the current Im which is caused to flow by applying a voltage between the selected word line 105 and the selected bit line 106 can be caused to be closer to a sneak path current of the first reference current Ir1 and the second reference current Ir2, thereby making it easy to determine data stored in the selected cell 107.

Seventh Embodiment

Figure 8:
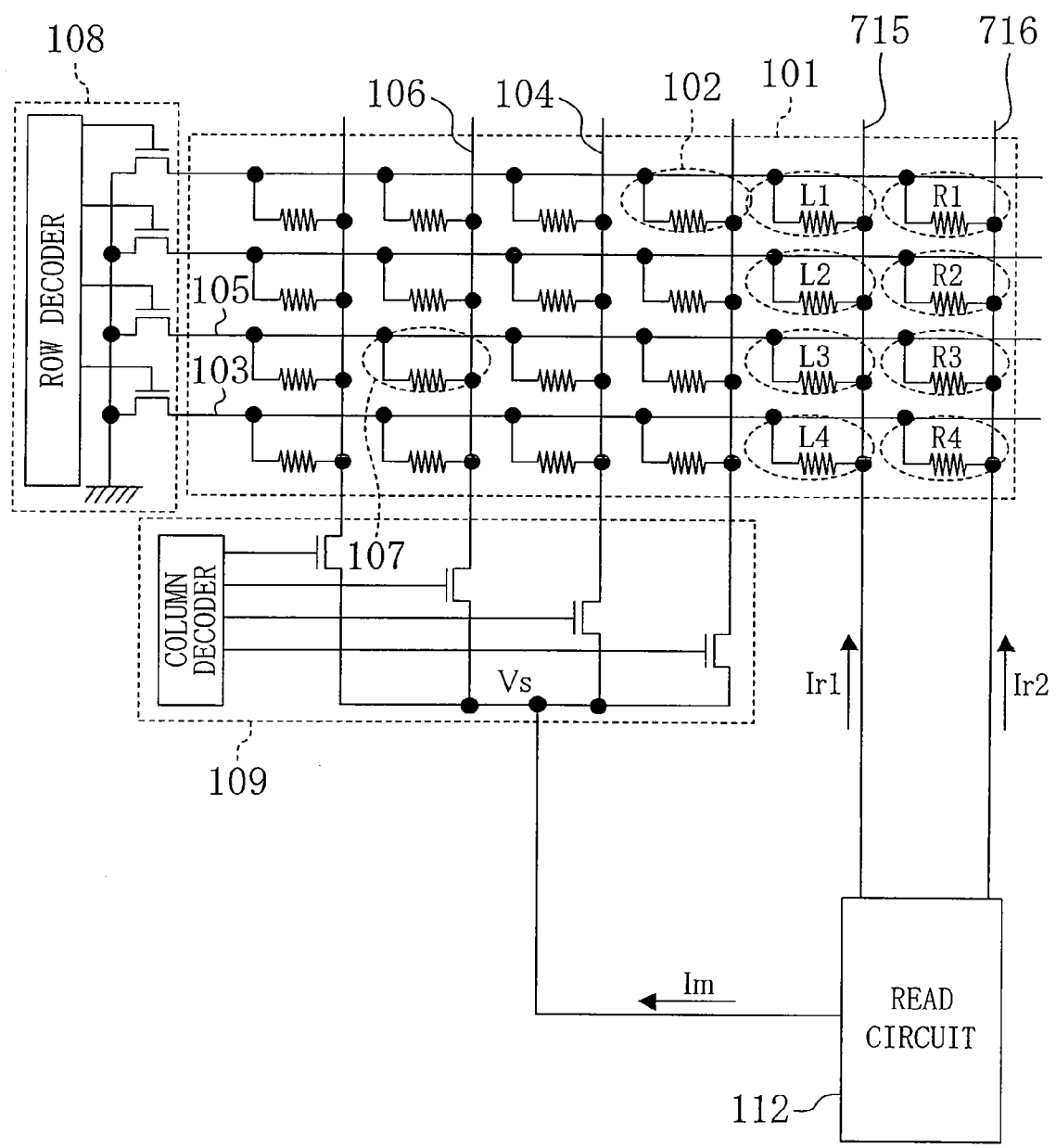
FIG. 8 is a diagram showing a circuit configuration of a non-volatile semiconductor memory device according to a seventh embodiment of the present invention.

FIG. 8 is a diagram showing a circuit configuration of a non-volatile semiconductor memory device according to a seventh embodiment of the present invention, which is the same as the circuit configuration of FIG. 7. In FIG. 8, L1, L2, L3, and L4 indicate first reference cells each of which shares a word line with a corresponding memory cell, and R1, R2, R3, and R4 indicate second reference cells each of which shares a word line with a corresponding memory cell. For example, a first reference cell corresponding to the selected cell 107 is L3 which shares a word line with the selected cell 107, and a second reference cell is R3 which shares a word line with the selected cell 107.

In this case, different data values are stored in the first reference cell and the second reference cell which share a word line (e.g., L1 stores data "0" while R1 stores data "1"), and the numbers of data "0" and data "1" stored in L1, L2, L3, and L4, which are connected to the first reference bit line 715, are caused to be substantially the same (e.g., L1 and L2 store data "0" and L3 and L4 store data "1").

In the configuration of FIG. 8, a first reference current Ir1 is a current which is caused to flow by applying a voltage between the selected word line 105 and the first reference bit line 715. A second reference current Ir2 is a current which is caused to flow by applying a voltage between the selected word line 105 and the second reference bit line 716.

By means of the configuration of FIG. 8, a sneak path current of the first reference current Ir1 can be caused to be closer to a sneak path current of the second reference current Ir2, thereby making it easy to determine data stored in the selected cell 107.

Eighth Embodiment

Figure 9:
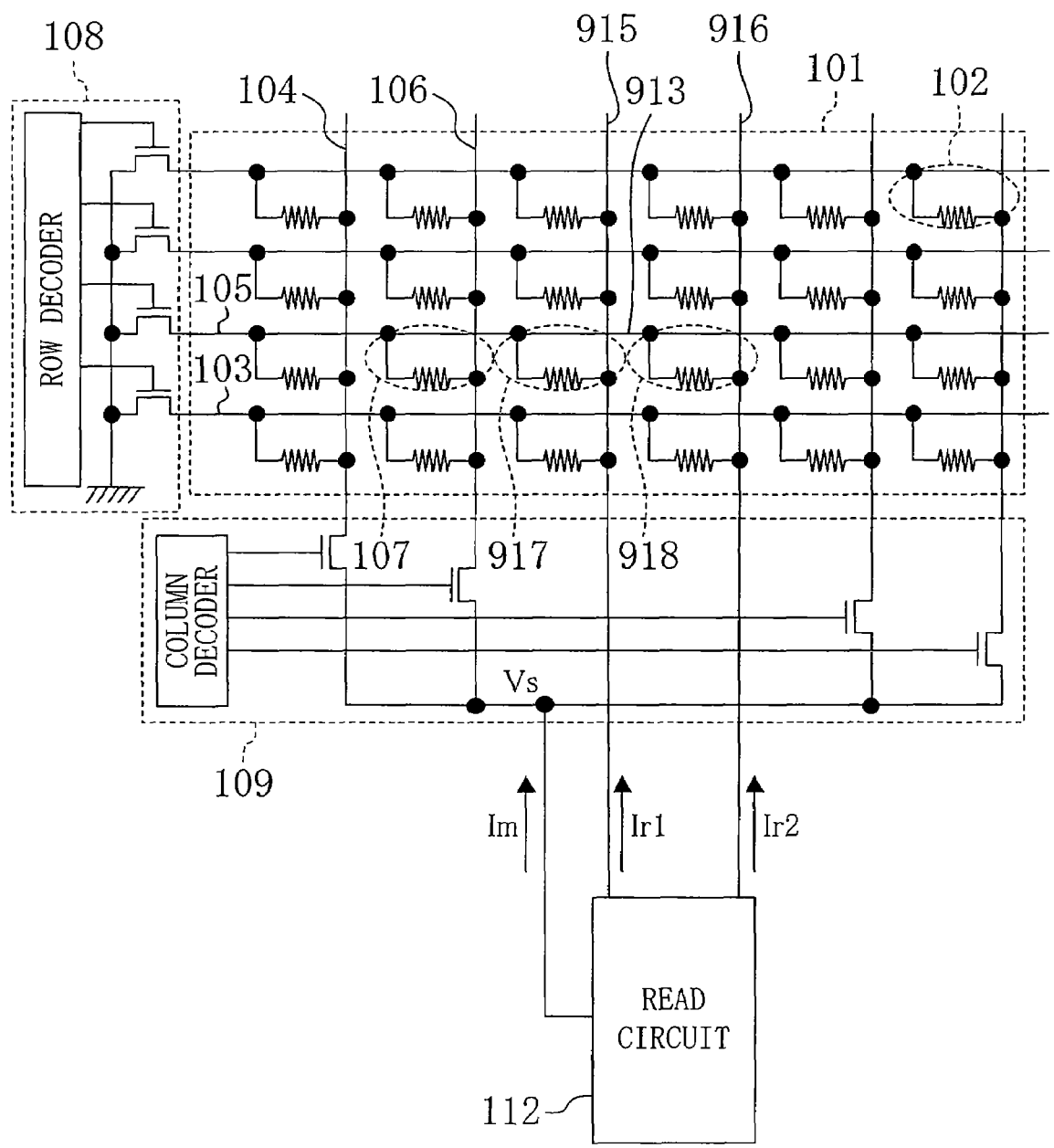
FIG. 9 is a diagram showing a circuit configuration of a non-volatile semiconductor memory device according to an eighth embodiment of the present invention.
Figure 10:
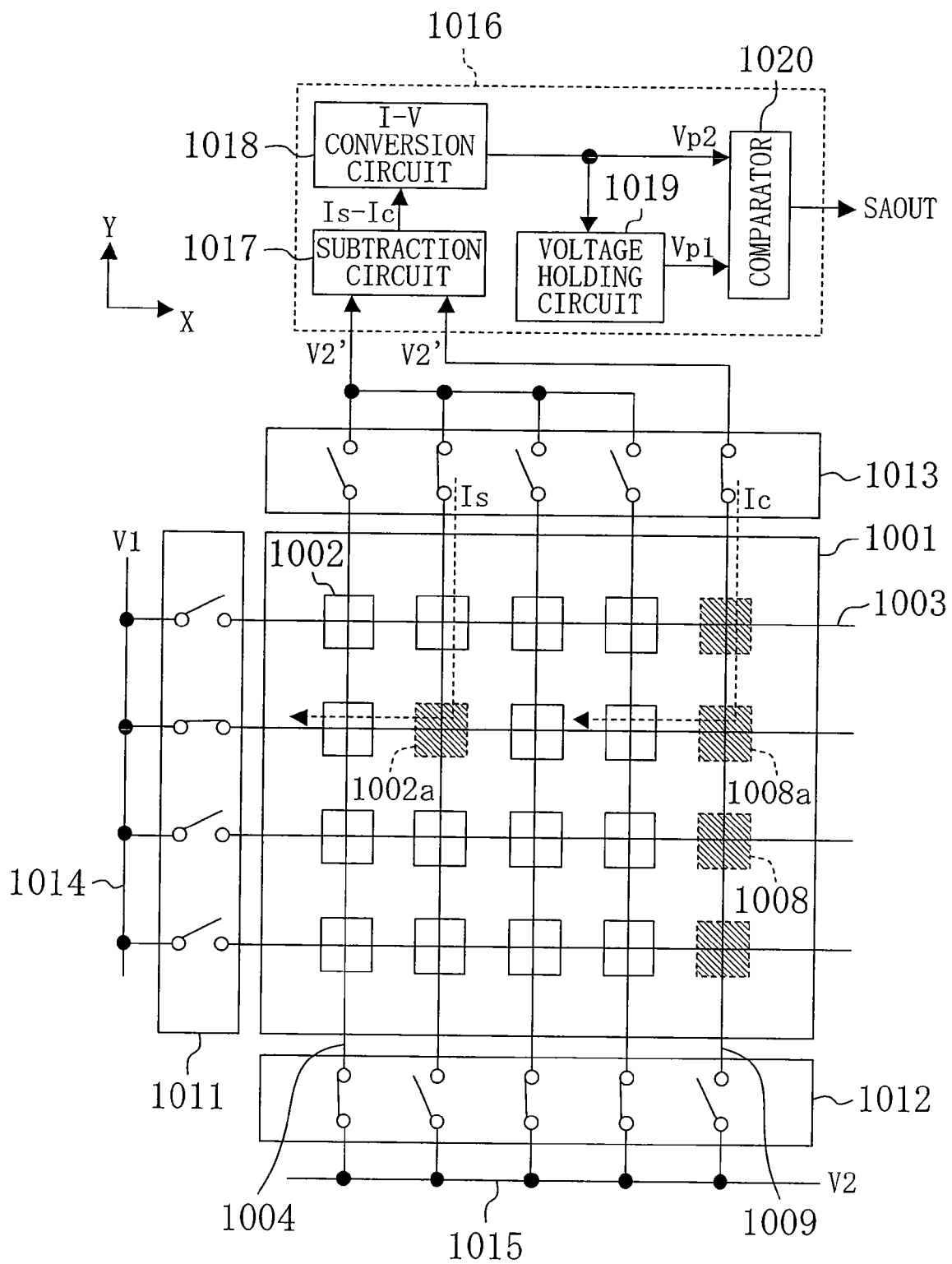
FIG. 10 is a diagram showing an exemplary circuit configuration of a conventional non-volatile semiconductor memory device.
Figure 11A:
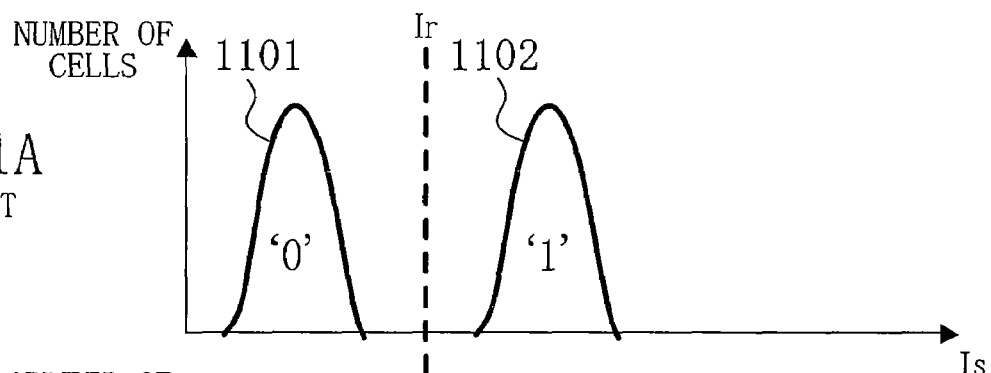
FIGS. 11A to 11C are diagrams showing changes in memory cell current of a conventional non-volatile semiconductor memory device.
Figure 11B:
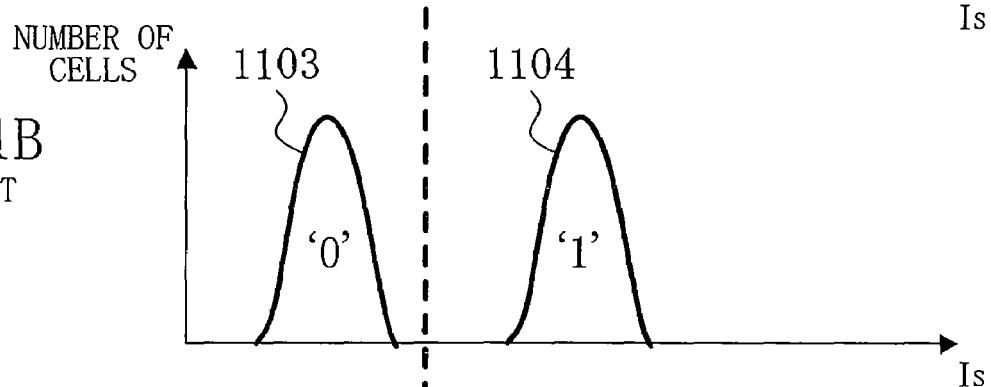
Figure 11C:
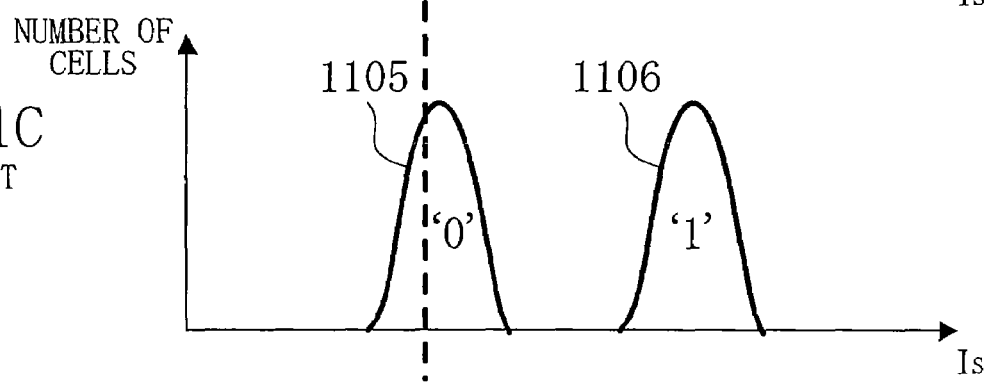

FIG. 9 is a diagram showing a circuit configuration of a non-volatile semiconductor memory device according to an eighth embodiment of the present invention, particularly showing the first reference current generating circuit 110 and the second reference current generating circuit 111 of FIG. 1 in detail. In FIG. 9, 913 indicates a selected reference word line, 915 indicates a first reference bit line, 916 indicates a second reference bit line, 917 indicates a first reference cell, and 918 indicates a second reference cell.

As shown in FIG. 9, the selected reference word line 913 is connected via the first reference cell 917 to the first reference bit line 915. The selected reference word line 913 is connected via the second reference cell 918 to the second reference bit line 916. The first reference bit line 915 and the second reference bit line 916 are connected to the read circuit 112.

The first reference bit line 915 and the second reference bit line 916 are assumed to be located at substantially a center portion of the cross-point cell array 101. In this case, it is desirable that the first reference bit line 915 and the second reference bit line 916 be adjacent to each other.

The first reference cell 917 and the second reference cell 918 are assumed to have the same structure as that of the memory cell 102. The selected reference word line 913 is assumed to be the same as the selected word line 105. The first reference bit line 915 and the second reference bit line 916 are assumed to have the same structure as that of the bit line 104. In this case, it is desirable that data "1" or data "0" be stored in the first reference cell 917 and inverted data of the first reference cell 917 be stored in the second reference cell 918.

In the configuration of FIG. 9, a first reference current Ir1 is a current which is caused to flow by applying a voltage between the selected word line 105 and the first reference bit line 915. A second reference current Ir2 is a current which is caused to flow by applying a voltage between the selected word line 105 and the second reference bit line 916.

By means of the configuration of FIG. 9, the first reference bit line 915 and the second reference bit line 916 are located at substantially a center portion of the cross-point cell array 101, so that a physical distance between the selected cell 107 and the first reference cell 917 (or the second reference cell 918) can be reduced as compared to when the first reference bit line 915 and the second reference bit line 916 are located at an end of the cross-point cell array 101. Thereby, a sneak path current of the current Im which is caused to flow by applying a voltage between the selected word line 105 and the selected bit line 106 can be caused to be closer to a sneak path current of the first reference current Ir1 and the second reference current Ir2, thereby making it easy to determine the data stored in the selected cell 107.

Note that the non-volatile semiconductor memory devices of the fourth to eighth embodiments of the present invention can be read using the reading methods of the first to third embodiments of the present invention.

The present invention is not limited to the particular embodiments described above and illustrated in the drawings. The present invention should be construed in accordance with the appended claims.

For example, in FIG. 3, a detection potential generating circuit for generating a detection potential corresponding to the current Im flowing through the selected bit line 106 can be provided in the read circuit 112, and the first reference current generating circuit 110 can be replaced with a first reference potential generating circuit, the second reference current generating circuit 111 can be replaced with a second reference potential generating circuit, the reference current selecting circuit 313 can be replaced with a reference potential selecting circuit, and the current difference signal generating circuit 314 and the I-V conversion circuit 315 can be replaced with a potential difference signal generating circuit.

Also, in FIG. 4, a detection potential generating circuit for generating a detection potential corresponding to the current Im flowing through the selected bit line 106 can be provided in the read circuit 112, and the first reference current generating circuit 110 can be replaced with a first reference potential generating circuit, the second reference current generating circuit 111 can be replaced with a second reference potential generating circuit, the first current difference signal generating circuit 413 and the first I-V conversion circuit 415 can be replaced with a first potential difference signal gener-
ating circuit, and the second current difference signal generating circuit 414 and the second I-V conversion circuit 416 can be replaced with a second potential difference signal generating circuit.

As described above, the present invention can improve the reliability of data during read of a memory cell, and is useful as, for example, a non-volatile memory having a resistive cross-point cell array.

What is claimed is:

1. A non-volatile semiconductor memory device comprising:
    a cross-point cell array;
    a plurality of word lines extended in a first direction;
    a plurality of bit lines extended in a second direction different from the first direction;
    a first decoding circuit for selecting a selected word line from the plurality of word lines;
    a second decoding circuit for selecting a selected bit line from the plurality of bit lines;
    a first reference signal generating circuit for generating a first reference signal;
    a second reference signal generating circuit for generating a second reference signal different from the first reference signal; and
    a read circuit,
    wherein the cross-point cell array includes a plurality of cells,
    each of the plurality of cells is interposed between one of the plurality of word lines and one of the plurality of bit lines,
    a selected cell is interposed between the selected word line and the selected bit line,
    based on a detection signal corresponding to a detection current which is caused to flow through the selected bit line by applying a voltage between the selected word line and the selected bit line, the read circuit compares a first difference signal corresponding to a difference between the detection signal and the first reference signal with a second difference signal corresponding to a difference between the detection signal and the second reference signal, thereby determining data stored in the selected cell.

2. The non-volatile semiconductor memory device of claim 1, wherein
    the first reference signal generating circuit is a first reference cell interposed between a first reference word line and a first reference bit line,
    the first reference signal is a current caused to flow through the first reference bit line by applying a voltage between the first reference word line and the first reference bit line,
    the second reference signal generating circuit is a second reference cell interposed between a second reference word line and a second reference bit line, and
    the second reference signal is a current caused to flow through the second reference bit line by applying a voltage between the second reference word line and the second reference bit line.

3. The non-volatile semiconductor memory device of claim 2, wherein
    the first reference cell is a cell having a first resistance value, and the second reference cell is a cell having a second resistance value different from the first resistance value.

4. The non-volatile semiconductor memory device of claim 2, wherein the first reference cell and the second reference cell are provided in the cross-point cell array.

5. The non-volatile semiconductor memory device of claim 4, wherein
the selected word line, the first reference word line, and the second reference word line are the same word line.

6. The non-volatile semiconductor memory device of claim 4, wherein
the first reference bit line is one of the plurality of bit lines, and the second reference bit line is another one of the plurality of bit lines.

7. The non-volatile semiconductor memory device of claim 6, wherein
the sum of resistance values of reference cells on the first reference bit line and the sum of resistance values of reference cells on the second reference bit line are substantially the same.

8. The non-volatile semiconductor memory device of claim 4, wherein
the first reference bit line and the second reference bit line are different bit lines of the plurality of bit lines.

9. The non-volatile semiconductor memory device of claim 4, wherein
the first reference bit line and the second reference bit line are adjacent bit lines of the plurality of bit lines.

10. The non-volatile semiconductor memory device of claim 4, wherein
the first reference cell and the second reference cell are located at substantially a center portion of the cross-point cell array or at substantially a center portion of a cell array to be read.

11. The non-volatile semiconductor memory device of claim 2, wherein
the first decoding circuit applies a voltage to the selected word line and the first reference word line during a first read operation period, and applies a voltage to the selected word line and the second reference word line during a second read operation period delayed in time from the first read operation period.

12. The non-volatile semiconductor memory device of claim 2, wherein
the first decoding circuit applies a voltage to the selected word line, the first reference word line, and the second reference word line.

13. The non-volatile semiconductor memory device of claim 2, wherein
the second decoding circuit applies a voltage to the selected bit line and the first reference bit line during a first read operation period, and applies a voltage to the selected bit line and the second reference bit line during a second read operation period delayed in time from the first read operation period.

14. The non-volatile semiconductor memory device of claim 2, wherein
the second decoding circuit applies a voltage to the selected bit line, the first reference bit line, and the second reference bit line.

15. The non-volatile semiconductor memory device of claim 1, wherein
the read circuit includes:
a difference signal generating circuit for generating the first difference signal corresponding to the difference between the detection signal and the first reference signal during a first read operation period, and generating the second difference signal corresponding to the difference between the detection signal and the second reference signal during a second read operation period delayed in time from the first read operation period;
a reference signal selecting circuit for connecting the first reference signal generating circuit to the difference signal generating circuit during the first read operation period, and connecting the second reference signal generating circuit to the difference signal generating circuit during the second read operation period;
a difference signal holding circuit for holding the first difference signal during the first read operation period; and
a data determining circuit for comparing the first difference signal held by the difference signal holding circuit with the second difference signal during the second read operation period, thereby determining data stored in the selected cell.

16. The non-volatile semiconductor memory device of claim 1, wherein
the read circuit includes:
a first difference signal generating circuit for generating the first difference signal corresponding to the difference between the detection signal and the first reference signal;
a second difference signal generating circuit for generating the second difference signal corresponding to the difference between the detection signal and the second reference signal; and
a data determining circuit for comparing the first difference signal with the second difference signal, thereby determining data stored in the selected cell.

17. A non-volatile semiconductor memory device comprising:
a cross-point cell array;
a plurality of word lines extended in a first direction;
a plurality of bit lines extended in a second direction different from the first direction;
a first decoding circuit for selecting a selected word line from the plurality of word lines;
a second decoding circuit for selecting a selected bit line from the plurality of bit lines;
a first reference signal generating circuit for generating a first reference signal;
a second reference signal generating circuit for generating a second reference signal different from the first reference signal; and
a read circuit for determining data stored in a selected cell based on a detection signal corresponding to a detection current flowing through the selected bit line,
wherein the read circuit includes:
a difference signal generating circuit for generating a difference signal corresponding to a difference between two different signals; and
a reference signal selecting circuit for connecting the first reference signal generating circuit to the difference signal generating circuit during a first read operation period, and connecting the second reference signal generating circuit to the difference signal generating circuit during a second read operation period delayed in time from the first read operation period, and
the read circuit connects the selected bit line via the second decoding circuit to the difference signal generating circuit and the first reference signal generating circuit to the difference signal generating circuit during the first read operation period, and connects the selected bit line via the second decoding circuit to the difference signal generating circuit and the second reference signal generating circuit to the difference signal generating circuit during the second read operation period.

18. The non-volatile semiconductor memory device of claim 17, wherein the second decoding circuit is provided with a function of the reference signal selecting circuit.

19. A non-volatile semiconductor memory device comprising:

a cross-point cell array;

a plurality of word lines extended in a first direction;

a plurality of bit lines extended in a second direction different from the first direction;

a first decoding circuit for selecting a selected word line from the plurality of word lines;

a second decoding circuit for selecting a selected bit line from the plurality of bit lines;

a first reference signal generating circuit for generating a first reference signal;

a second reference signal generating circuit for generating a second reference signal different from the first reference signal; and a read circuit for determining data stored in a selected cell based on a detection signal corresponding to a detection current flowing through the selected bit line, wherein the read circuit includes:

a first difference signal generating circuit for generating a first difference signal corresponding to a difference between the detection signal and the first reference signal; and a second difference signal generating circuit for generating a second difference signal corresponding to a difference between the detection signal and the second reference signal, and the read circuit connects the selected bit line via the second decoding circuit to the first difference signal generating circuit and the first reference signal generating circuit to the first difference signal generating circuit, and connects the selected bit line via the second decoding circuit to the second difference signal generating circuit and the second reference signal generating circuit to the second difference signal generating circuit.

* * * * *